United States Patent [19]

Tsuboi et al.

[11] Patent Number: 4,939,583
[45] Date of Patent: Jul. 3, 1990

[54] ENTROPY-CODING SYSTEM

[75] Inventors: Yukitoshi Tsuboi, Yokohama; Masaaki Takizawa, Koganei, both of Japan

[73] Assignee: Hitachi, Ltd., Tokyo, Japan

[21] Appl. No.: 241,388

[22] Filed: Sep. 7, 1988

[30] Foreign Application Priority Data

Sep. 7, 1987 [JP] Japan .................... 62-221953
Sep. 7, 1987 [JP] Japan .................... 62-221954

[51] Int. Cl.⁵ ............................................ H04N 1/419
[52] U.S. Cl. ................................ 358/261.1; 358/426; 358/427; 382/56
[58] Field of Search .............. 358/260, 261.1, 261.4, 358/426, 427; 382/56; 375/122

[56] References Cited

U.S. PATENT DOCUMENTS

| | | | |
|---|---|---|---|
| 4,555,802 | 11/1985 | Fedak et al. | 382/56 |
| 4,602,383 | 7/1986 | Ogawa et al. | 358/261.3 |
| 4,646,356 | 2/1987 | Anderson et al. | 358/261.4 |
| 4,743,973 | 5/1988 | Endo et al. | 358/260 |
| 4,745,473 | 5/1988 | Hall | 358/260 |
| 4,800,441 | 1/1989 | Sato | 358/261.1 |

FOREIGN PATENT DOCUMENTS 62-108663  5/1987  Japan .

Primary Examiner—Howard W. Britton
Assistant Examiner—Kim Yen Vu
Attorney, Agent, or Firm—Antonelli, Terry, Stout & Kraus

[57] ABSTRACT

An entropy coding system in a code assign system for processing image coded data such that for data (particular data) having a particular value, a run length coding is achieved on a run length thereof and for data (nonparticular data) having a value other than the particular value, a Huffman coding is conducted on the value thereof so as to generate a coded or resultant code. When achieving the Huffman coding on the nonparticular date, for the nonparticular data immediately following particular data, the coding operation is executed by use of a Huffman coding table including prefix codes, whereas for the nonparticular data not immediately following particular data, the coding operation is achieved by use of a Huffman coding table including prefix codes.

9 Claims, 8 Drawing Sheets

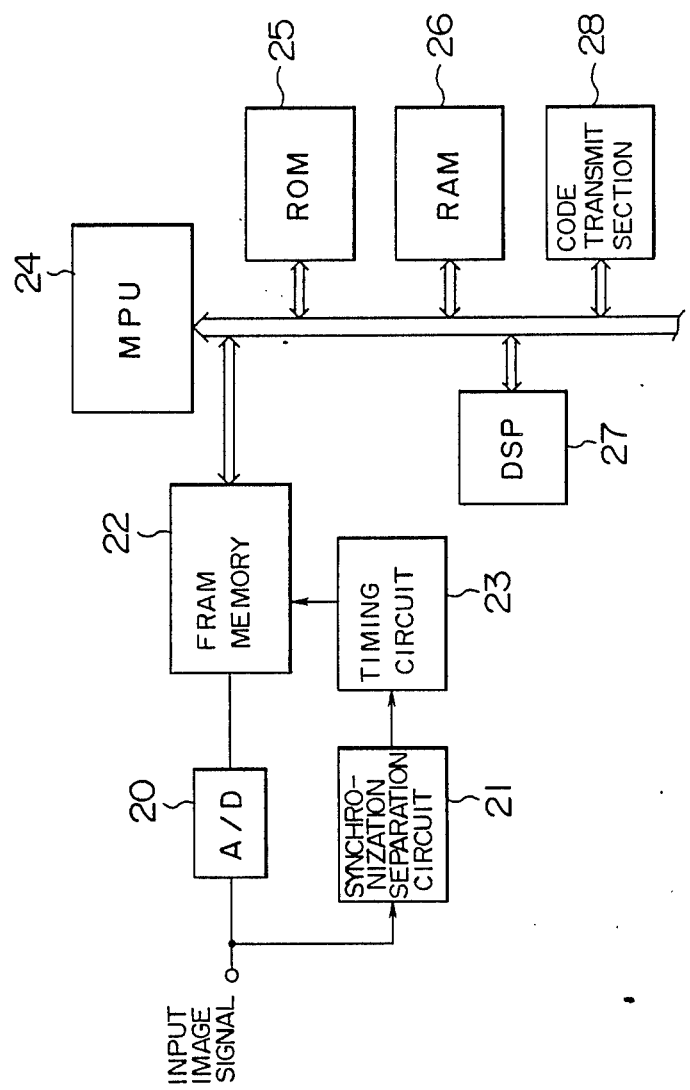
F I G. 7

ENTROPY-CODING SYSTEM

BACKGROUND OF THE INVENTION

The present invention relates to a highly efficient image coding system for coding an image employed in an image transmitting apparatus and the like, and in particular, to an entropy-coding system which has a high encoding efficiency and which is capable of reducing the total number of bits after the coding operation among the systems in which nonsignificant data (having a value of 0) is subjected to a run-length coding and significant data (having a value other than 0) is subjected to an ordinary Huffman coding.

Incidentally, in the Japanese Patent Unexamined Publication JP-A-62-108663, there is described a highly efficient image coding system in which the Huffman coding and the run length coding are applied to the significant and nonsignificant data, respectively.

According to the Huffman coding, a code system of which each code comprises a reduced number of bits is applied to data frequently appearing with a higher probability of occurrence, whereas a code system of which each code comprises a greater number of bits is applied to data less frequently appearing with a lower probability of occurrence. In addition, according to the run length coding, a run length determined for a sequence of the same data is processed as data so as to be assigned with a variable length code like in the case of the Huffman coding.

In the system, based on a fact that consecutive significant data (of the Huffman code) is immediately followed by the nonsignificant data (of the run length code), a cluster code (a prefix code of the run length code) is added so as to follow the consecutive Huffman code.

With this provision of a cluster code, as compared with a system in which a code type judge bit is added at the first bit position of the Huffman code and the run length code, the coding efficiency is improved and the total number of the bits after the coding operation can be reduced.

However, since the run length code has a prefix code therebefore in every case, when the run length code appears frequently, the prefix code also appears with the same frequency, which results in a lowering of the coding efficiency.

SUMMARY OF THE INVENTION

It is therefore an object of the present invention to provide a coding system having a higher efficiency.

The object above can be achieved, since data immediately following nonsignificant data (of the run length code) is significant data (of the Huffman code), by separately effecting Huffman coding on the significant data immediately following the nonsignificant data and the significant data other than those nonsignificant data by use of different coding tables, respectively. That is, for the significant data immediately following the nonsignificant data, a second Huffman coding is achieved by use of a second Huffman coding table not including prefix codes; whereas, for the other significant data, a first Huffman coding is achieved by use of a first Huffman coding table including prefix codes.

Since the significant data can be classified into two kinds so as to be subjected to the Huffman coding without using any additional information, the total number of bits after the coding operation is minimized as compared with the case where the Huffman coding is achieved on data not classified into two kinds.

In addition, for this coding operation, there are not disposed a Huffman coding table for the significant data and a run length coding table for the nonsignificant data for the respective coding operations. The coding operations are accomplished by use of a composite coding table for the Huffman and run length codings. In consequence, as compared with the case where the significant and nonsignificant data are to be coded separately, and the code length obtained for each data associated therewith is long, the prefix code of the run length code is unnecessary and hence the coding efficiency is improved.

BRIEF DESCRIPTION OF THE DRAWINGS

The present invention will be more apparent from the following detailed description taken in conjunction with the accompanying drawings in which:

FIGS. 1, 3, 5 and 7 are block diagrams respectively showing embodiments according to the present invention;

DESCRIPTION OF THE PREFERRED EMBODIMENTS

Figure 1:
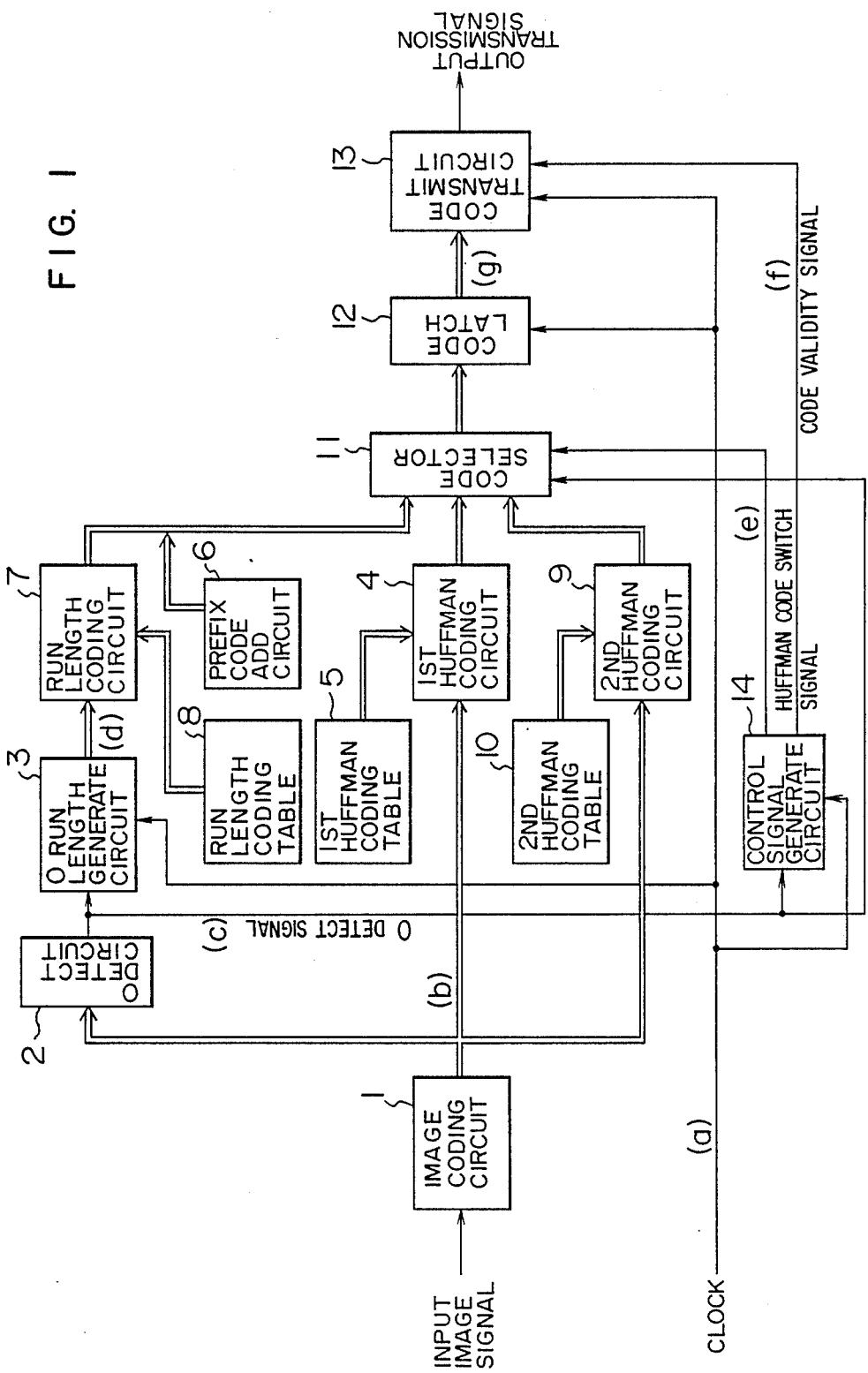

FIG. 1 is a block diagram showing an embodiment according to the present invention.

In this configuration, an image coding or encoding circuit 1 effects an analog-to-digital conversion on an input image signal, achieves a forecast coding on the resultant signal (achieves a signal quantization according to the difference associated with the image data), and outputs coded data. A zero (0) detect circuit 2 judges to determine whether the coded data is 0 (nonsignificant) or not (significant). A 0 run length generate circuit 3 generates 0 run length data from the 0 detect signal.

A first Huffman coding circuit 4 processes significant data other than those immediately following nonsignificant data by use of a first Huffman coding table 5 so as to produce variable-length codes. A run length coding circuit 7 converts the 0 run length data into variable length codes by use of a run length coding table 8. A prefix code add circuit 6 is employed to add a prefix code at the first position of the resultant code or coded data. A second Huffman coding circuit 9 processes significant data immediately following the nonsignificant data by use of a second Huffman coding table 10 so as to produce variable-length codes. A code selector 11 operates in response to a 0 detect signal and a Huffman code change-over or switch signal from a control signal generate circuit 14 so as to select one of the outputs from the respective coding circuits 4, 7, and 9.

A code latch 12 delays the resultant code by one clock, whereas a code transmit circuit 13 receives or fetches the resultant code according to a code validity signal so as to sequentially output the code as a transmission signal generate circuit. In addition, the control signal 14 generates a Huffman code switch signal and a code validity signal from the 0 detect signal.

Incidentally, since nonsignificant data is immediately followed by significant data in any case, it is not necessary to discriminate between the significant data and the nonsignificant data and hence the second Huffman coding table 10 does not contain a prefix code as shown in Table 2 (c).

Figure 2:
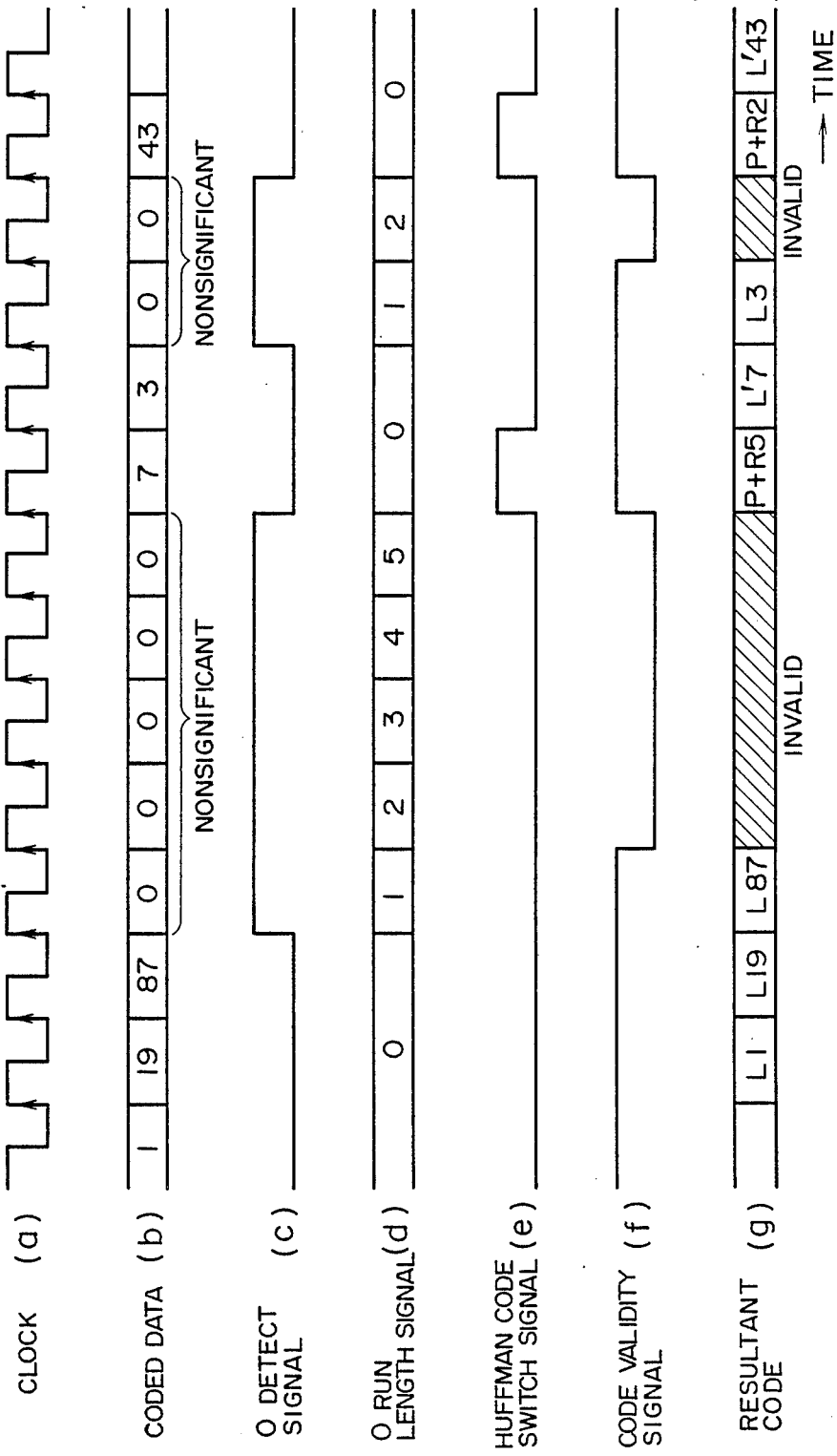
FIGS. 2, 4, and 6 are waveform diagrams showing waveforms developed at primary sections of the embodiments of FIGS. 1, 3, and 5, respectively.

FIG. 2 is a signal timing chart of the respective signals of FIG. 1. First, according to a clock (a), the image coding circuit 1 outputs coded data (b). The 0 detect circuit 2 checks to determine whether or not the coded data is 0 so as to output a 0 detect signal (c), and then the 0 run length generate circuit 3 generates 0 run length data (d).

The code selector 11 effects a change-over or switch operation for the coded or resultant codes as outputs from the respective coding circuits 4, 7, and 9 based on the Huffman code switch signal (e) and the code validity signal (f). As a result, the resultant code (g) delayed through the code latch 12 by one clock is supplied to the code transmit circuit 13, which receives the resultant code only when the code validity signal (f) is active. Incidentally, the Huffman code switch signal (e) and the code validity signal (f) are generated from the 0 detect signal (c) and the signal obtained by delaying the 0 detect signal (c) by one clock in the control signal generate circuit 14.

In (b) and (d) of FIG. 2, the digit n indicates the value of the data. In addition, Ln in (g) designates resultant code corresponding to significant data (having value n) other than those immediately following non-significant data, Rn designates resultant code corresponding to 0 run length data (having value n), and P denotes a prefix code. Furthermore, L'n indicates the resultant code associated with significant data (having value n) immediately following nonsignificant data.

Figure 3:
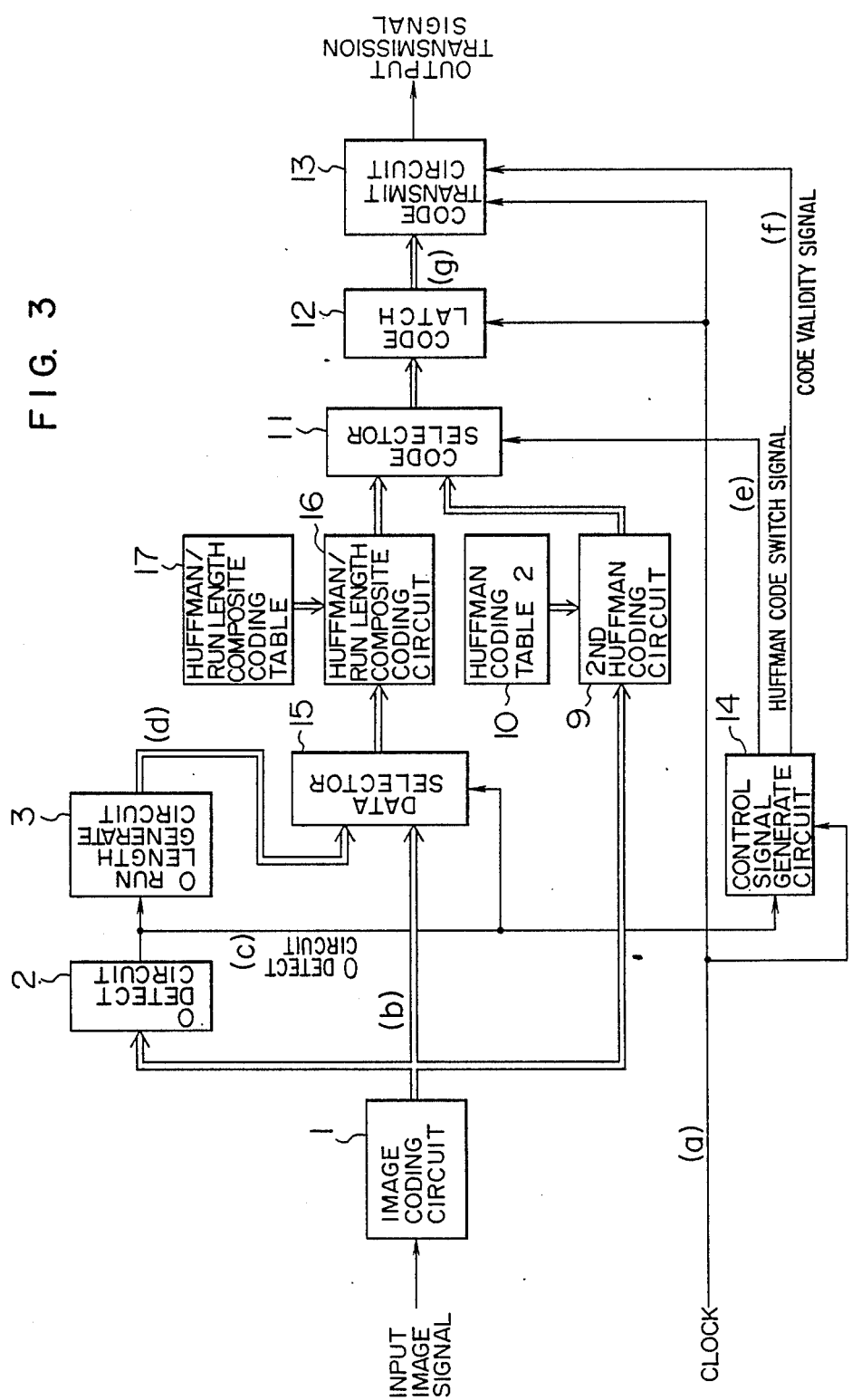
Figure 4:
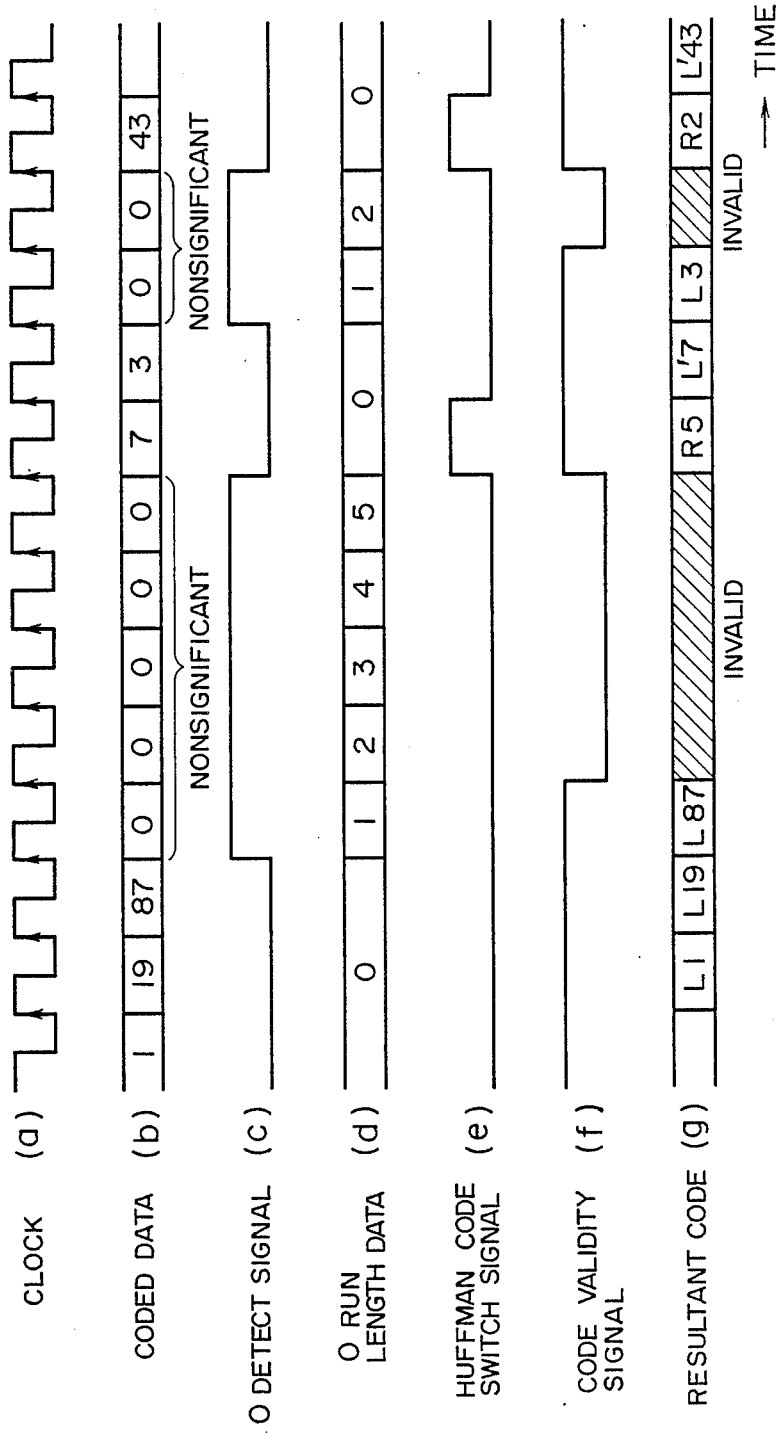

FIG. 3 is a block diagram showing a second embodiment according to the present invention. In addition, FIG. 4 is a signal timing chart for explaining the operation of the apparatus of FIG. 3.

In the embodiment of FIG. 3, in order to reduce the number of bits after the coding operation by unnecessitating the prefix code to be added at the first position of a run length code, there is disposed a Huffman/run length composite coding system in which the Huffman coding and the run length coding are combined.

A data selector 15 selects and outputs the 0 run length data (d) and the coded data (b) when the coded data is nonsignificant and significant, respectively according to the 0 detect signal (c). Incidentally, a bit is added to the 0 run length data (d) at a high-order position thereof for the discrimination from the coded data (b). Moreover, the Huffman/run length composite coding circuit 16 converts the 0 run length data (d) of the coded data (b) into a variable-length code by use of a Huffman/run length composite coding table 17 so as to output a resultant code. However, the significant data immediately following the nonsignificant data is processed, like in the case of FIG. 1, in the second Huffman coding circuit 9 to produce a variable-length code therefrom by use of the second Huffman coding table 10.

In a case of the significant data immediately after the nonsignificant data, a code selector 11 selects and outputs the resultant code as an output from the second Huffman coding circuit 9 based on the Huffman code switch signal (e). In other cases, the resultant code as an output from the Huffman/run length composite coding circuit 16 is selected and outputted according to the Huffman code switch signal (e). A code transmit circuit 13 then receives the resultant code (g) delayed by a code latch 11 by one clock only when the code validity signal (e) is active, thereby sequentially outputting the resultant code (g) as a transmission signal. Incidentally, the Huffman code switch signal (e) and the code validity signal (f) are generated by the control signal generate circuit 14 from the 0 detect signal (c) and the signal obtained by delaying the 0 detect signal (c) by one clock.

FIG. 4 shows a signal timing chart, which is almost the same as that of FIG. 2; however, a different point therebetween is that the prefix code is missing in the resultant code (g). In FIG. 4, the digit n in (c) and (d) denotes the value of the data; whereas Ln in (f) indicates a resultant code corresponding to the significant data (having value n) other than those immediately following the nonsignificant data and Rn designates a resultant code associated with 0 run length data (having value n). In addition, L'n indicates a resultant code corresponding to the significant data (having value n) immediately following the nonsignificant data.

Although the description has been given of a case where the image coding circuit 1 achieves a forecast coding operation, this system is naturally applicable to other cases in the similar fashion, for example, to a case where after the input image signal undergoes the analog-to-digital conversion, the image data is subdivided into blocks each having an appropriate block size for an orthogonal transformation (by use of a discrete cosine transformation or the Hadamard's transformation) so as to quantize transformation coefficients after the orthogonal transformation.

In this case, the DC coefficient (having the lowest order) of the transformation coefficients becomes to be an average value of the image data of the block and the deviation of the distribution is small, which reduces the effect of the entropy coding. To overcome this difficulty, it is also possible to effect a fixed-length coding on the DC coefficient and to achieve the entropy coding only on the AC coefficients (having the higher order) according to the present system.

Furthermore, the operation may be achieved as follows, namely, the coded data as the output from the image coding circuit 1 is subdivided into blocks such that of the 0 run length data, the 0 run length data up to the final position of a block is assumed to be particular EOB data, which is handled in the same manner as for the significant data so as to undergo the entropy coding in accordance with the present system. Since the 0 run length data having various run lengths can be processed as the same EOB data, the entropy associated with the coded data (the significant data and the EOB data) and the 0 run length data (up to an intermediate point of a block) is minimized and hence the total number of bits after the entropy coding operation is reduced.

Description will be given of an example of the content of an actual coding table and the total number of bits after the coding operation. In a case where the image coding circuit 1 conducts a transformation coding (a discrete cosine transformation with a block size of 8 dots by 8 dots), the distribution of the coded data for an image is developed, for example, as shown in Table 1, where the positive and negative data are collectively processed and the 0 run length data up to the final position of a block are handled as the EOB data.

TABLE 1

(a). [Coded data (significant)]:

| Data | | Frequency 1 | Frequency 2 | Frequency |
|---|---|---|---|---|
| Value | 1 | 1661 | 2527 | 4188 |
| | 2 | 277 | 173 | 450 |
| | 3 | 83 | 48 | 131 |
| | 4 | 26 | 14 | 40 |
| | 5 | 13 | 7 | 20 |
| | 6 | 2 | 2 | 4 |
| | 7 | 1 | 0 | 1 |
| | 8 | 1 | 3 | 4 |
| | 9 | 2 | 0 | 2 |
| 10 | 127 | 0 | 0 | 0 |
| Total | | 2066 | 2774 | 4840 |

0 run length data up to the EOB are collectively processed as the EOB run regardless of the run length thereof.
Frequency 2 for data immediately after nonsignificant data; Frequency 1 for other data.
Total number of nonsignificant data is 136,028 and hence that of the coded data is 110,868.

(b). [0 run length data (nonsignificant)]:

| Data | | Frequency |
|---|---|---|
| Value | 1 | 914 |
| | 2 | 319 |
| | 3 | 198 |
| | 4 | 187 |
| | 5 | 194 |
| | 6 | 149 |
| | 7 | 108 |
| | 8 | 89 |
| | 9 | 105 |
| | 10 | 87 |
| | 11 | 57 |
| | 12 | 55 |
| | 13 | 70 |
| | 14 | 46 |
| | 15 | 24 |
| | 16 | 22 |
| | 17 | 20 |
| | 18-19 | 27 |
| | 20-23 | 26 |
| | 24-31 | 45 |
| | 32-63 | 32 |
| EOB run | | 1114 |
| Total | | 3888 |

(a). [coding table for prefix code and 1st Huffman code]

| Data | | Code length | Code |
|---|---|---|---|
| P | | 1 | 0 |
| EOB | | 3 | 101 |
| L | 1 | 3 | 11S |
| | 2 | 5 | 1001S |
| | 3 | 6 | 10001S |
| | 4 | 7 | 100001S |
| | 5 | 8 | 1000001S |
| | 6 | 10 | 100000001S |
| | 7 | 11 | 1000000001S |
| | 8-15 | 12 | 10000001BBBS |
| | 16-31 | 16 | 10000000000BBBBS |
| | 32-63 | 18 | 100000000010BBBBBS |
| | 64-127 | 19 | 100000000011BBBBBBS |

(b). [Run length coding table]

| Data | | Code length | Code |
|---|---|---|---|
| R | 1 | 2 | 11 |
| | 2 | 3 | 010 |
| | 3 | 4 | 1011 |
| | 4 | 4 | 1001 |
| | 5 | 4 | 1010 |
| | 6 | 4 | 0110 |
| | 7 | 4 | 0001 |
| | 8 | 5 | 10000 |
| | 9 | 4 | 0000 |
| | 10 | 5 | 01110 |
| | 11 | 5 | 00101 |
| | 12 | 5 | 00100 |
| | 13 | 5 | 00111 |
| | 14 | 6 | 100010 |
| | 15 | 7 | 1000110 |
| | 16 | 7 | 0111101 |
| | 17 | 7 | 0111100 |
| | 18-19 | 7 | 001100B |
| | 20-23 | 9 | 1000111BB |
| | 24-31 | 9 | 011111BBB |
| | 32-63 | 11 | 001101BBBBB |

P = Prefix code,
Ln = Huffman code,
Rn = Run length code,
Sn = Positive/negative sign,
B = bit pattern

(c). [2nd Huffman coding table]

| Data | | Code length | Code |
|---|---|---|---|
| L' | 1 | 2 | 1S |
| | 2 | 3 | 01S |
| | 3 | 4 | 001S |
| | 4 | 5 | 0001S |
| | 5 | 6 | 00001S |
| | 6 | 8 | 0000001S |
| | 7 | 9 | 00000000S |
| | 8-15 | 10 | 000001BBBS |
| | 16-31 | 14 | 000000010BBBBS |
| | 32-63 | 16 | 0000000110BBBBBS |
| | 64-127 | 17 | 0000000111BBBBBBS |

L'n = Huffman code,
S = Positive/negative sign,
B = Bit pattern.

For the coded data of Table 1, experiments have been conducted by generating appropriate coding tables according to the prior art described above, namely, the coding table for the prefix code and Huffman code and the run length coding table. As a result, the number of bits after the coding operation is obtained as 0.221 bits per data. On the other hand, according to the present invention adopting Table 2, the number of bits after the coding operation is attained as 0.210 bits per data.

Figure 5:
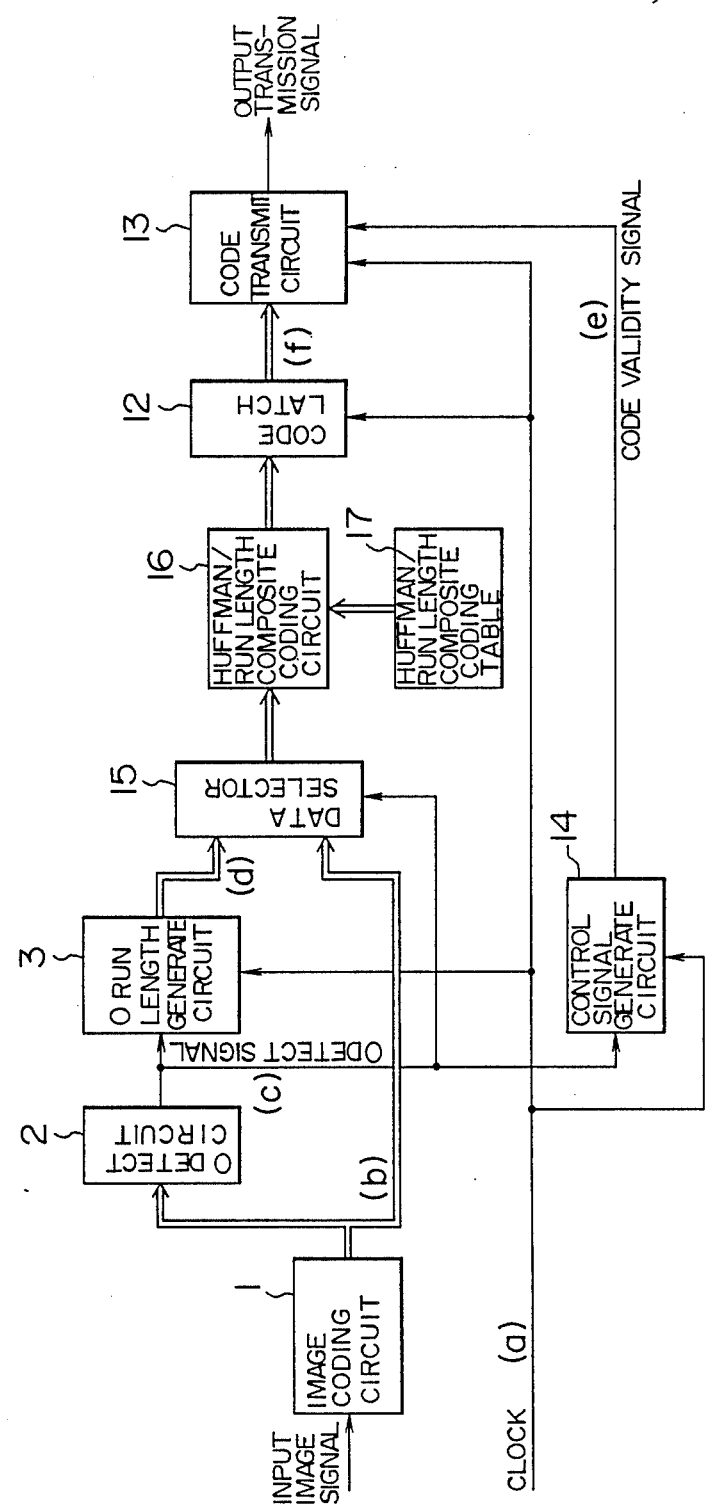

FIG. 5 shows still another embodiment according to the present invention.

This embodiment is implemented by removing the components associated with the second Huffman coding operation from the configuration of FIG. 3.

Figure 6:
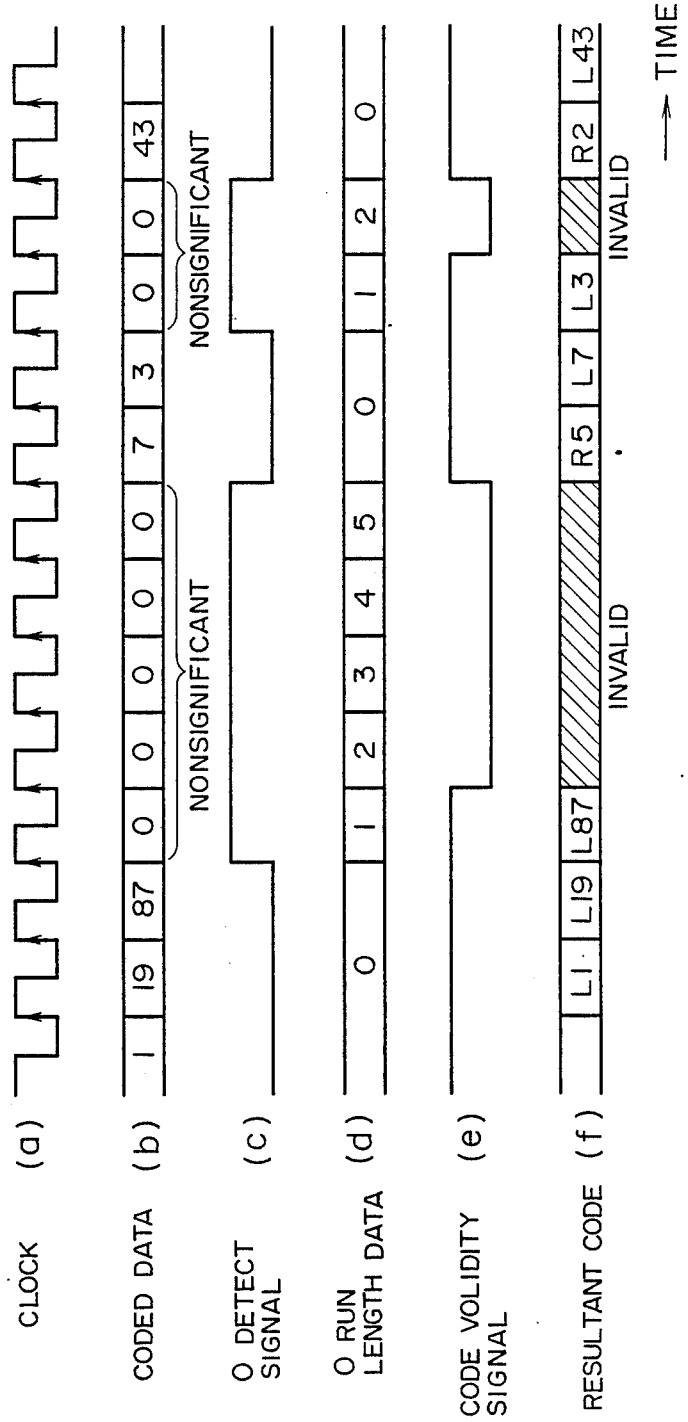

FIG. 6 shows a signal timing chart of the respective signals in FIG. 5.

First, the image coding circuit 1 outputs coded data (b) in response to the clock (a), the 0 detect circuit 2 checks to determine whether or not the coded data is 0 so as to output the 0 detect signal (c), and the 0 run length generate circuit 3 generates the 0 run length data (d).

The data selector 4 achieves a change-over operation between the 0 run length data (d) and the coded data (b) in response to the 0 detect signal (c). The obtained data is processed by the Huffman/run length composite coding circuit 16 to be a variable-length code, which is then delayed by the code latch 12 by one clock so as to generate the coded or resultant code (f) to be supplied to the code transmit circuit 13. The code transmit circuit 13 receives the resultant code only when the code validity signal (e) is active. Incidentally, the code validity signal (e) is generated through an NAND operation between the 0 detect signal (c) and the signal obtained by delaying the 0 detect signal (c) by one clock in the control signal generate circuit 14.

In FIG. 5, the digit n in (b) and (d) denotes the value of the data, Ln in (f) indicates the resultant code corresponding to the significant coded data (having value n), and Rn designates the resultant code associated with the 0 run length data (having value n).

Although the description has been given of a case where the image coding circuit 1 conducts a forecast coding operation, the configuration of FIG. 5 is also applicable to the other cases in the similar fashion as for the embodiments described above.

Table 3 is a coding table (Huffman/run length composite coding table) generated, based on the coding tables of Table 1, so as to be suitable for the operation effected by the configuration of FIG. 5. In this case, the number of bits after the coding operation is 0.219 bits per data, which is improved as compared with the conventional result of 0.221 bits per data.

TABLE 3

(Huffman/run length composite coding table)

| Data | | Code length | Code |
|---|---|---|---|
| EOB | | 3 | 110 |
| L | 1 | 2 | 0S |
| | 2 | 5 | 1010S |
| | 3 | 7 | 101101S |
| | 4 | 9 | 101111018 |
| | 5 | 10 | 1011000118 |
| | 6 | 11 | 10110001008 |
| | 7 | 14 | 101100010100IS |
| | 8 | 12 | 10110001011S |
| | 9 | 13 | 1011000101018 |
| | 10-11 | 17 | 10110001010000BS |
| | 12-15 | 18 | 101100010100001BBS |
| | 16-31 | 20 | 101100010100010BBBBS |
| | 32-63 | 22 | 1011000101000110BBBBBS |
| | 64-127 | 23 | 10110001010001111BBBBBBS |
| R | 1 | 3 | 100 |
| | 2 | 5 | 11100 |
| | 3 | 6 | 111101 |
| | 4 | 6 | 111011 |
| | 5 | 6 | 111100 |
| | 6 | 6 | 101110 |
| | 7 | 7 | 1111110 |
| | 8 | 7 | 1110101 |
| | 9 | 7 | 1111101 |
| | 10 | 7 | 1011111 |
| | 11 | 8 | 11111111 |
| | 12 | 8 | 11111110 |
| | 13 | 7 | 1011001 |
| | 14 | 8 | 11111000 |
| | 15 | 9 | 111110010 |
| | 16 | 9 | 111010001 |
| | 17 | 9 | 111010000 |
| | 18-19 | 9 | 10110000B |
| | 20-23 | 11 | 111110011BB |
| | 24-31 | 11 | 11101001BBB |
| | 32-63 | 13 | 10111100BBBBB |

Ln = Huffman code,
Rn = Run length code,
S = Positive/negative sign,
B = Bit pattern.

FIG. 7 shows an alternative embodiment according to the present invention in which a discrete cosine transformation is employed in the image coding system.

In this configuration, an input image signal is digitized by an analog-to-digital converter 20 so as to be stored in a frame memory 22. The subsequent image coding operations are completely softwarewise achieved by use of a microprocessor (MPU) 24 and a digital signal processor (DSP) 27.

A read only memory (ROM) 25 is disposed to store programs for the image coding operation, whereas a random access memory (RAM) 26 is used as a work memory for the processing.

Figure 8:
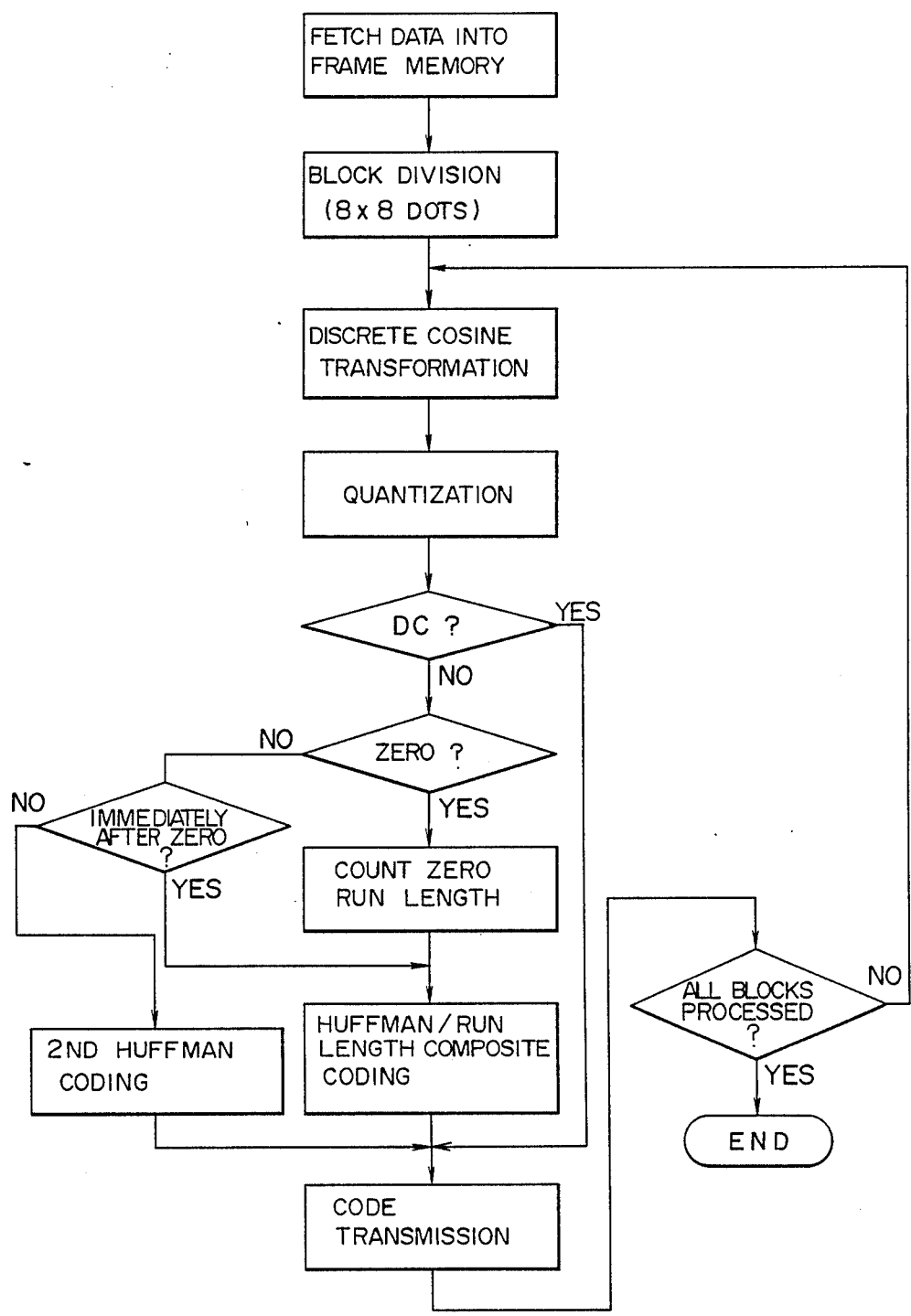
FIG. 8 is a flowchart of the operation achieved in the embodiment of FIG. 7.

FIG. 8 is a flowchart showing a flow of the coding operation. Image data in the frame memory 22 is subdivided by the MPU 24 into blocks each having a block size of 8 dots by 8 dots and the resultant blocks are transferred to the DSP 27. The DSP 27 effects the discrete cosine transformation on these blocks to quantize each transformation coefficient according to an appropriate bit length. The subsequent processing of the coding operation, which is the same as that effected in the embodiment of FIG. 4, is achieved by the MPU 24.

We claim:

1. An entropy coding system comprising:
    transform means for transforming an image signal into coded data;
    run length coding means operative to particular data having a particular value in the coded data for effecting a run length coding on a run length of the particular data; and
    Huffman coding means, having a second Huffman coding table not including prefix codes and a first Huffman coding table including prefix codes, for effecting a Huffman coding on nonparticular data immediately following the particular data based on the first Huffman coding table and for effecting a Huffman coding on nonparticular data not immediately following the particular data based on the second Huffman coding table.

2. An entropy coding system comprising:
    transform means for transforming an image signal into coded data;
    first coding means having a first Huffman coding table including prefix codes for effecting a Huffman coding on particular data in the coded data and nonparticular data immediately following the particular data based on the first Huffman coding table; and
    second coding means having a second Huffman coding table not including prefix codes for effecting a Huffman coding on nonparticular data not immediately following the particular data based on the second Huffman coding table.

3. An entropy coding system comprising:
    transform means for transforming an image signal into input coded data;
    nonsignificant data detect means for detecting nonsignificant data contained in the input coded data;
    run length generate means for generating a run length of the nonsignificant data in the input coded data;
    data select means responsive to an output from said nonsignificant data detect means for selecting output data from said run length generate means for an input of nonsignificant data and for selecting the input coded data for an input of significant data, said selected data being outputted with an identification code assigned thereto; and
    Huffman/run length composite coding means for receiving as an input thereto an output from said data select means for effecting a Huffman/run length composite coding based on a Huffman/run length composite coding table in which a run length coding table and a Huffman coding table are combined.

4. An entropy coding system comprising:
transform means for transforming an image signal into multi-value data;
distinguishing means for distinguishing said multi-value data between a nonsignificant value and a significant value;
run length detection means for detecting a run length of said nonsignificant value; and
coding means, having a Huffman table showing a corresponding relationship between said significant values and binary coded data without a prefix code corresponding to said nonsignificant value and a run length table showing a corresponding relationship between the run length and another binary coded data, for generating said binary coded data based on said Huffman table in response to said multi-value data when a significant value is distinguished by said distinguishing means and based on said run length table in response to said run length detected by said run length detection means when a nonsignificant value is distinguished by said distinguishing means.

5. An entropy coding method comprising the steps of:
transforming an image signal into multi-value data;
distinguishing said multi-value data between a nonsignificant value and a significant value;
detecting a run length of said nonsignificant value; and
generating binary coded data based on a Huffman table in response to said multi-value data when a significant value is distinguished by said step of distinguishing and based on a run length table in response to said run length detected by said step of detecting when a nonsignificant value is distinguished by said step of distinguishing, said Huffman table showing a corresponding relationship between significant values and binary coded data without a prefix code corresponding to said nonsignificant value and said run length table showing a corresponding relationship between run length and another binary coded data.

6. An entropy coding system comprising:
transform means for transforming an image signal into multi-value data;
distinguishing means for distinguishing said multi-value data between a nonsignificant value and a significant value;
detecting means for detecting whether said significant value immediately follows said nonsignificant value;
run length detection means for detecting a run length of said nonsignificant value; and
coding means, having a first Huffman table showing a corresponding relationship between significant values which immediately follow said nonsignificant value and first binary coded data having a prefix code corresponding to said nonsignificant value, a run length table showing a corresponding relationship between said run length and second binary coded data and a second Huffman table showing a corresponding relationship between significant values which do not immediately follow said nonsignificant value and third binary coded data not having a prefix code corresponding to said nonsignificant value, for generating said first binary coded data based on said first Huffman table in response to said multi-value data when a significant value is distinguished by said distinguishing means and is detected as one immediately following said nonsignificant value by said detecting means, said second binary coded data based on said run length table in response to said run length detected by said run length detection means when said nonsignificant value is distinguished by said distinguishing means and said third binary coded data based on said second Huffman table in response to said multi-value data when a significant value is distinguished by said distinguishing means and is detected as one not immediately following said nonsignificant value by said detecting means.

7. An entropy coding method comprising the steps of:
transforming an image signal into multi-value data;
distinguishing said multi-value data between a nonsignificant value and a significant value;
detecting whether said significant value immediately follows said nonsignificant value;
detecting a run length of said nonsignificant value; and
generating first binary coded data based on a first Huffman table in response to said multi-value data when a significant value is distinguished by said step of distinguishing and said significant value is detected as one immediately following said nonsignificant value by said step of detecting second binary coded data based on a run length table in response to said run length detected by said step of detecting a run length when said nonsignificant value is distinguished by said step of distinguishing and third binary coded data based on a second Huffman table in response to said multi-value data when a significant value is distinguished by said step of distinguishing and said significant value is not detected as one immediately following said nonsignificant value by said step of detecting said first Huffman table showing a corresponding relationship between significant values which immediately follow said nonsignificant value and first binary coded data having a prefix code corresponding to said nonsignificant value, said run length table showing a corresponding relationship between run length and second binary coded data and said second Huffman table showing a corresponding relationship between said significant values which do not immediately follow said nonsignificant value and third binary coded data not having a prefix code corresponding to said nonsignificant value.

8. An entropy coding system comprising:
transform means for transforming an image signal into multi-value data;
distinguishing means for distinguishing said multi-value data between a significant value which immediately follows a nonsignificant value, other values including a significant value which does not immediately follow said nonsignificant value and said nonsignificant value;
coding means, having a Huffman table showing a corresponding relationship between significant values immediately following said nonsignificant value and binary coded data having a prefix code corresponding to said nonsignificant value and another table showing a corresponding relationship between said other values and another binary coded data not having said prefix code corresponding to said nonsignificant value, for generating said binary coded data based on said Huffman table in response to said multi-value data when said significant value immediately following said nonsignificant value is distinguished by said distinguishing means and based on said another table in response to said multi-value data when said other values are distinguished by said distinguishing means.

9. An entropy coding method comprising the steps of:
transforming an image signal into multi-value data;
distinguishing said multi-value data between a significant value which immediately follows a nonsignificant value, other values including a significant value which does not immediately follow said nonsignificant value and said nonsignificant value;
generating binary coded data based on a Huffman table in response to said multi-value data when said significant value immediately following said nonsignificant value is distinguished by said step of distinguishing and based on another table in response to said multi-value data when said other values are distinguished by said step of distinguishing, said Huffman table showing a corresponding relationship between significant values immediately following said nonsignificant value and binary coded data having a prefix code corresponding to said nonsignificant value and said another table showing a corresponding relationship between said other values and binary coded data not having said prefix code corresponding to said nonsignificant value.

* * * * *